United States Patent [19]
Kashiwagi et al.

[11] Patent Number: 5,864,944
[45] Date of Patent: Feb. 2, 1999

[54] MOUNTING APPARATUS OF ELECTRONIC COMPONENTS AND MOUNTING METHODS OF THE SAME

[75] Inventors: Yasuhiro Kashiwagi; Kazuhide Nagao, both of Fukuoka; Takeshi Morita, Chikushino, all of Japan

[73] Assignee: Matsushita Electric Industrial Co., Ltd., Osaka, Japan

[21] Appl. No.: 780,664

[22] Filed: Jan. 7, 1997

[30] Foreign Application Priority Data

Jan. 8, 1996 [JP] Japan ..................................... 8-000546
Jan. 30, 1996 [JP] Japan ..................................... 8-013683

[51] Int. Cl.$^6$ ........................... H05K 3/30; H05K 13/04; H05K 13/08
[52] U.S. Cl. ................................. 29/833; 29/712; 29/721; 29/740; 29/743; 294/64.1; 356/152.2; 364/559; 414/737; 414/752; 901/47
[58] Field of Search ........................... 29/739, 740, 741, 29/743, 832, 833, 712, 721; 356/152.1–152.3; 901/40, 47; 294/2, 64.1; 348/87; 364/559; 414/737, 752

[56] References Cited

U.S. PATENT DOCUMENTS

| | | | |
|---|---|---|---|
| 4,706,379 | 11/1987 | Seno et al. ................................. | 29/740 |
| 4,908,092 | 3/1990 | Koibuchi ............................... | 29/743 X |
| 5,040,291 | 8/1991 | Janisiewicz et al. .................. | 29/740 X |
| 5,084,962 | 2/1992 | Takahashi et al. .......................... | 29/833 |
| 5,539,977 | 7/1996 | Kano et al. ............................ | 29/740 X |
| 5,724,722 | 3/1998 | Hashimoto .............................. | 29/721 X |

FOREIGN PATENT DOCUMENTS

| | | | |
|---|---|---|---|
| 4123500 | 4/1992 | Japan ........................................ | 29/721 |
| 6232597 | 8/1994 | Japan ........................................ | 29/721 |

Primary Examiner—Peter Vo
Attorney, Agent, or Firm—McDermott, Will & Emery

[57] ABSTRACT

An apparatus and method for improving the productivity and accuracy of mounting electronic components on a substrate. The mounting apparatus includes a line-sensor for image recognition, a carriage head 20 having plural nozzles 21a, 21b and 21c aligned along a predetermined axis. The carriage head 20 is transferred along the direction of the aligned nozzles and above the line-sensor 33 of a recognition member 30. The line-sensor 33 takes images in sequence of the electronic components (chip) vacuum chucked by each nozzle 21a, 21b and 21c in order to recognize positions of the chips 12. Then, based on the recognition results, position deviations of the chips 12 with regard to X, Y and θ directions are compensated, and the chips 12 are mounted onto specified coordinate spots of substrate 3. The recognition member 30 includes an adjusting means of rotation angle for crossing the longitudinal direction of line-sensor 33 with the transferring direction of nozzles 21a, 21b and 21c at right angles.

5 Claims, 13 Drawing Sheets

FIG. 9

| | STATE OF JIG 60 | STATE OF LINE-SENSOR 33 | IMAGE OF JIG 60 |
|---|---|---|---|
| PROCESS 1 | 1-A | 1-B | 1-C |
| PROCESS 2 | 2-A | 2-B | 2-C |
| PROCESS 3 | 3-A | 3-B | 3-C |

MOUNTING APPARATUS OF ELECTRONIC COMPONENTS AND MOUNTING METHODS OF THE SAME

FIELD OF THE INVENTION

The present invention relates to an apparatus and method for mounting electronic components stacked in a part-feeder onto a substrate by picking them up with a nozzle of a carriage head and more particularly, to position recognition of an electronic component through a line-sensor with an image of the electronic components held by the nozzle.

BACKGROUND OF THE INVENTION

An apparatus for mounting an electronic component (chip) picks up a chip stacked in a part-feeder with a nozzle of a carriage head by vacuum chucking, and then transfers the chip to a specified coordinate spot on a substrate. Since the chip vacuum chucked at the bottom of the nozzle is deviated in position with regard to X, Y and θ directions, the deviations are detected by a recognition member and are compensated for before the chip is mounted on the substrate.

The recognition member using a line-sensor is widely known. Typically, the line-sensor comprises photo sensing devices such as CCD (Charge Coupled Device) arranged in linear lines, and the chip is transferred across the longitudinal direction of an array of the sensing devices at right angles. During the transfer, the line-sensor photo-senses the chip to produce surface information of the chip image. The position deviations are detected accurately because CCD is a high resolution device.

A recognition method utilizing a conventional line-sensor is explained with reference to FIG. 13.

FIG. 13 is a top view depicting a chip recognition method by a conventional mounting apparatus of electronic components, where the chip is transferred above a line-sensor 103 incorporated in the mounting apparatus of electronic components. A chip 101 is vacuum chucked at the bottom of the nozzle 102 of the carriage head. The carriage head picks up the chip 101 stacked in the part-feeder by vacuum chucking to the bottom of the nozzle 102, and transfers the chip to the substrate (not shown.) During the transfer, the chip passes above the line-sensor 103, which takes images of the chip 101, and an image recognizing means recognizes the position of chip 101 according to the images, and detects deviations with regard to X, Y and θ directions.

The conventional mounting apparatus, however, does not work at a high speed, and a user cannot expect an efficient operation because a single nozzle 102 of a single carriage head picks up one chip 101 at a time, and the nozzle 102 goes back and forth across the line-sensor 103 between the part-feeder and the substrate in order to mount each individual chip onto the substrate.

Further, as shown in FIG. 13, although a transferring direction N1 of the chip 101 must cross the longitudinal direction N2 of the line-sensor 103 at right angles, the angle is sometimes deviated by θ with respect to an axis K whose direction is at right angles to N1. (The angle θ is described as the "rotation angle" in this specification.) When the line-sensor 103 is slanted as shown, an image of chip 101 taken through the line-sensor 103 is distorted, thereby producing a recognition error. Therefore, the user cannot always expect an accurate mounting of the chip 101 onto the substrate.

SUMMARY OF THE INVENTION

The present invention aims to solve the foregoing problems, namely, an object of the invention is to provide a method and apparatus for mounting electronic components at a high rate of speed.

Another object of the invention is to provide a method and apparatus for mounting electronic components which can mount electronic components with improved accuracy by detecting and compensating for the rotation angle of the line-sensor.

An exemplary embodiment of the apparatus for mounting electronic components according to the present invention comprises: a substrate transferring means for transferring a substrate, a carriage head comprising a plurality of nozzles aligned along a predetermined axis, an X-axis table for transferring said carriage head substantially parallel along the predetermined axis, a Y-axis table for transferring said carriage head across the predetermined axis at substantially right angles thereto, a plurality of part feeders disposed on the side of said substrate transferring means, and a line-sensor disposed between said substrate transferring means and said plurality of part feeders with a longitudinal direction thereof at substantially right angles to said predetermined axis.

In accordance with this embodiment, the carriage head is transferred above said line-sensor along the predetermined axis to take images in sequence of electronic components vacuum chucked by said nozzles, where the positions of said electronic components are recognized, and said carriage head is transferred based on the recognized positions of said electronic components above said substrate, and then the electronic components vacuum chucked by said nozzles are mounted onto specified coordinate spots of said substrate.

In another embodiment of the present invention, the apparatus for mounting electronic components comprises: a carriage head for picking up electronic components stacked in part feeders by vacuum chucking them with nozzles, and transferring and mounting the electronic components onto the substrate; a line-sensor disposed along a path of said carriage head; a jig mounted to said carriage head; and a rotation adjusting means for adjusting a rotation angle of said line-sensor.

The present invention also relates to a method of mounting electronic components. An exemplary method comprises the steps of: picking up electronic components stacked in part feeders in sequence with a plurality of aligned nozzles by transferring a carriage head holding the aligned plurality of nozzles along a predetermined axis and above the part feeders disposed along the predetermined axis; taking images in sequence of the electronic components vacuum chucked by said nozzles by transferring said carriage head comprising the aligned nozzles above a line-sensor disposed between a substrate and said part feeders, said longitudinal direction of the line-sensor across at substantially right angles to said predetermined axis; recognizing positions of said electronic components vacuum chucked by said nozzles based on the taken images; and mounting said electronic components vacuum chucked by said nozzles in sequence onto specified coordinate spots by transferring said carriage head above said substrate based on the recognized positions.

Another method of mounting electronic components according to the invention includes the following steps: detecting a rotation angle of the line-sensor by image recognition of the line-sensor through taking a target formed on the jig mounted to the carriage head, where the image is recognized when the jig is moved above the line-sensor; revising the rotation angle of the line-sensor by rotating the line-sensor horizontally so that the rotation angle becomes across the substrate transferring direction at right angles; and mounting the electronic components onto the substrate through recognizing positions of the electronic components based on the images taken by the line-sensor, where the images are formed through the line-sensor of which rotation angle has been compensated observing the electronic components which are vacuum chucked at the bottoms of nozzles held by the carriage head.

Yet another method of mounting electronic components of the invention includes the following steps: detecting a rotation angle of the jig by recognizing the target formed thereon, where the jig is mounted to the carriage head and the jig is moved above the line-sensor which recognizes the target; revising the rotation angle of the jig by rotating the jig horizontally based on the detected rotation angle; detecting the rotation angle of the line-sensor through recognizing the target by again moving the jig of which rotation angle has been compensated above the line-sensor; compensating the rotation angle of the line-sensor by rotating the line-sensor horizontally so that the rotation angle becomes right angles relative to the transferring direction of the carriage head; and mounting the electronic components onto the substrate through recognizing the positions of the electronic components based on the images thereof taken through the line-sensor having the compensated rotation angle and observing the electronic components vacuum chucked at the bottoms of the nozzles held by the carriage head.

The apparatus and methods for mounting electronic components according to the present invention provide the following advantages:

(1) various kinds of electronic components can be mounted onto the substrate at a high speed, because each nozzle held by the carriage head in one straight line picks up electronic components in sequence and moves along the line on which plural nozzles are aligned and above the line-sensor disposed with its longitudinal direction being in parallel with the Y-axis so that the line-sensor takes images of each electronic component sequentially, and after recognizing positions of electronic components the carriage head mounts them one by one onto the substrate, and (2) electronic components can be mounted on the substrate with more accuracy, because the rotation angle of the line-sensor with regard to the transferring direction of electronic components is detected so that the rotation angle may be compensated, and positions of each electronic component are recognized more accurately.

The invention itself, together with further objects and attendant advantages, will best be understood by reference to the following detailed description, taken in conjunction with the accompanying drawings.

BRIEF DESCRIPTION OF THE DRAWINGS

FIG. 9 illustrates how to adjust a rotation angle of the line-sensor of the mounting apparatus.

DETAILED DESCRIPTION OF THE EMBODIMENTS

In the following, the present invention is described in detail in conjunction with embodiments thereof by reference to the attached drawings.

Figure 1:
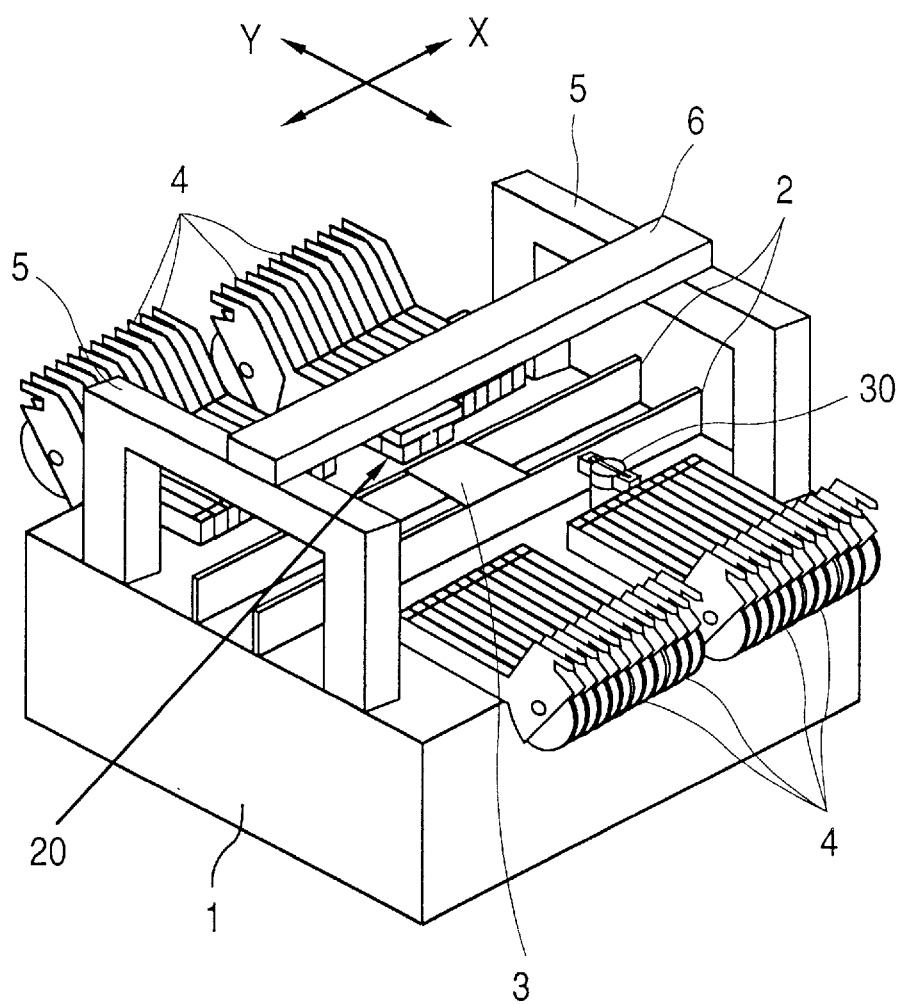
FIG. 1 is a perspective view of an apparatus for mounting electronic components according to an exemplary embodiment of the present invention.
Figure 2:
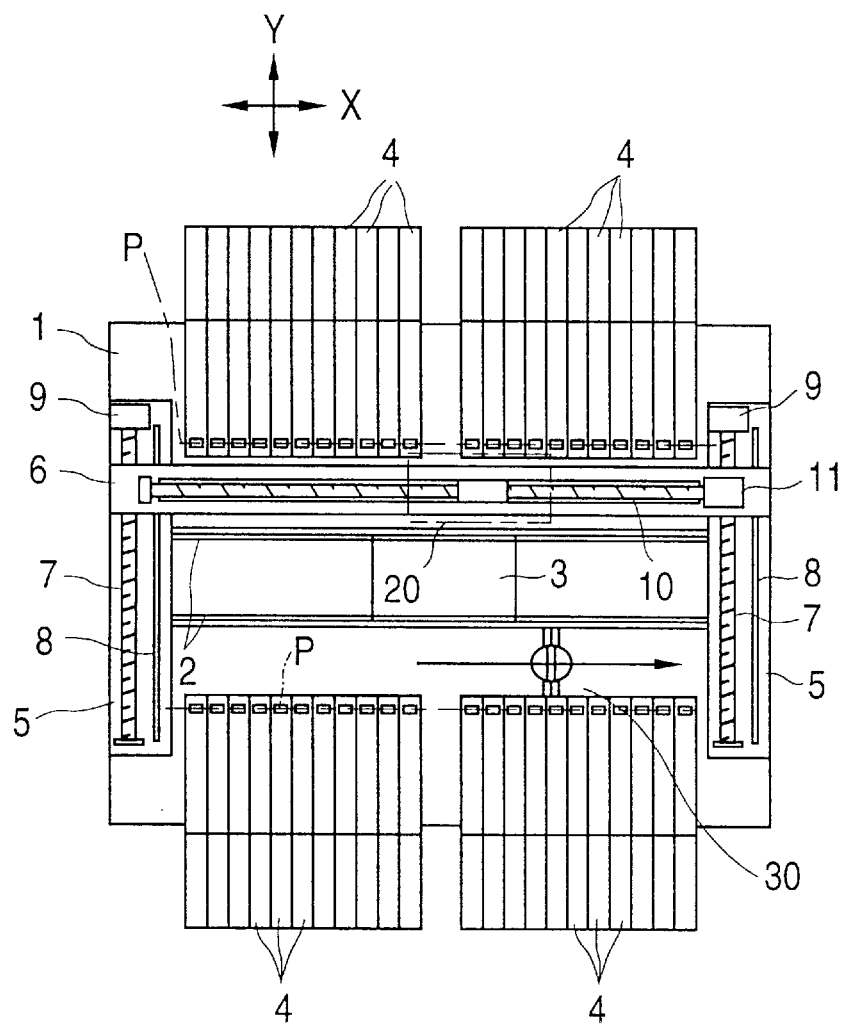
FIG. 2 is a top view of the mounting apparatus of electronic components shown in FIG. 1.

FIGS. 1 and 2, illustrate an exemplary embodiment of the present invention. As shown, the exemplary embodiment of the mounting apparatus comprises the following elements disposed on a base 1: a guide rail 2 for transferring a substrate 3 along the X axis is disposed on the center surface, where the guide rail 2 represents a substrate transferring means, and a large number of part-feeders 4 for stacking electronic components (chip) are disposed on both sides of guide rail 2 along the transferring direction (i.e. X-axis direction) of the substrate 3. In addition, outlets at tips of each part-feeder 4 for removing chips are aligned on a straight line P directed along the X-axis.

As depicted in FIG. 1, two Y-axis tables 5 are mounted on both sides of the base 1 with an orientation relative to the transferring direction of substrate 3 at right angles. On the Y-axis tables, an X-axis table 6 is mounted with an orientation relative to the Y-axis tables at right angles and also parallel with the transferring direction of the substrate 3. Both ends of the X-axis table 6 are coupled with the Y-axis table 5 so that the X-axis table 6 is movable along a longitudinal direction of the Y-axis table 5. The carriage head 20 is mounted to the X-axis table 6 so that the carriage head 20 can move along the X-axis table.

As depicted in FIG. 2, a ball screw 7 and a guide rail 8 both oriented along the Y-axis direction are mounted inside the Y-axis table 5. A Y-axis motor 9 drives to rotate the ball screw 7, which causes the X-axis table to move along the Y-axis. On the other hand, a ball screw 10 oriented along the X-axis direction is mounted to the X-axis table 6. An X-axis motor 11 drives to rotate the ball screw 10, which causes the carriage head 20 to move along the X-axis, i.e. the direction in which the plural nozzles are aligned. Thus, the carriage head 20 can be moved in both the X or Y directions by driving the X-axis motor 11 and Y-axis motor 9.

Figure 3:
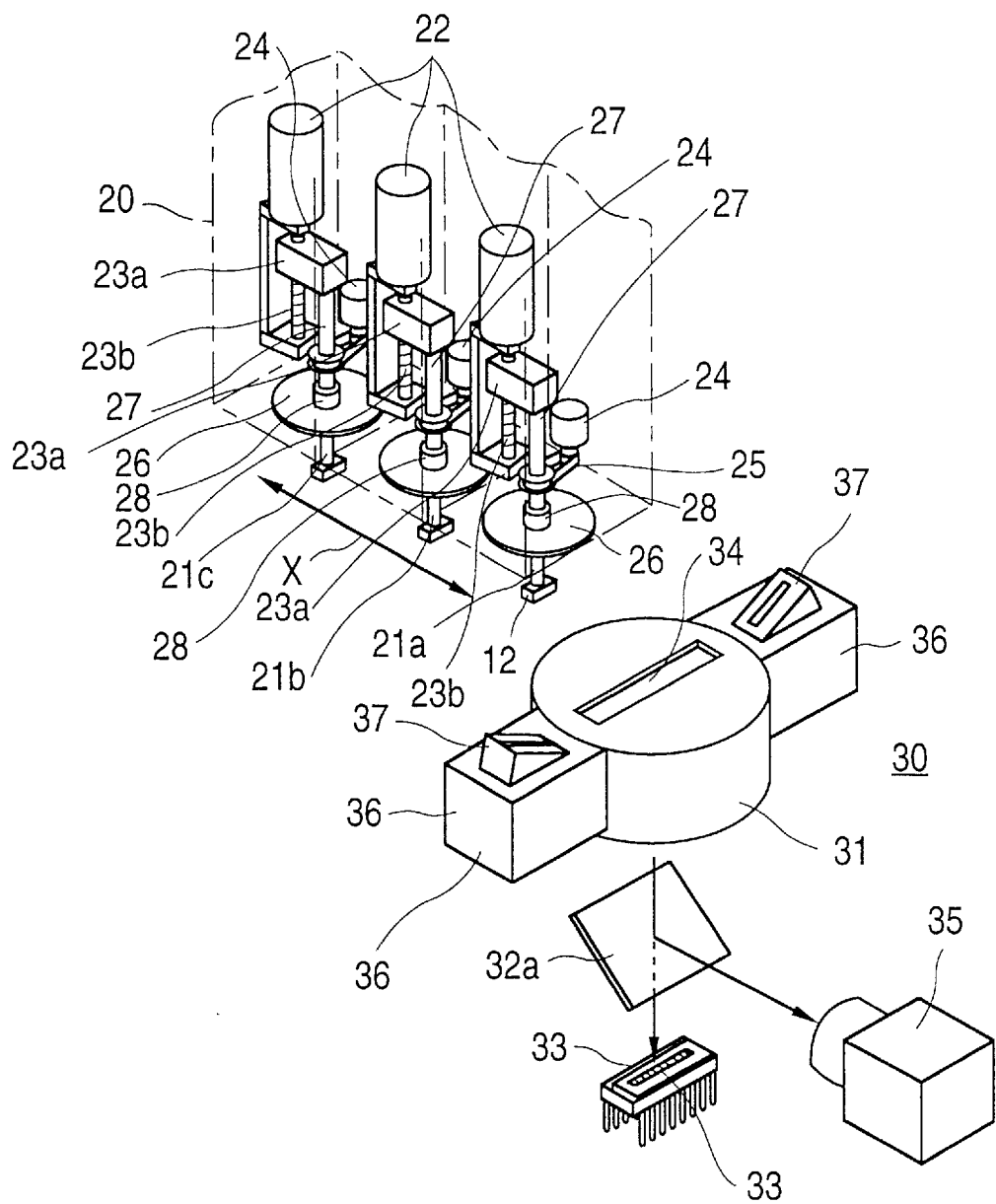
FIG. 3 is a perspective view of a carriage head and line-sensor of the mounting apparatus of FIG. 1.
Figure 7:
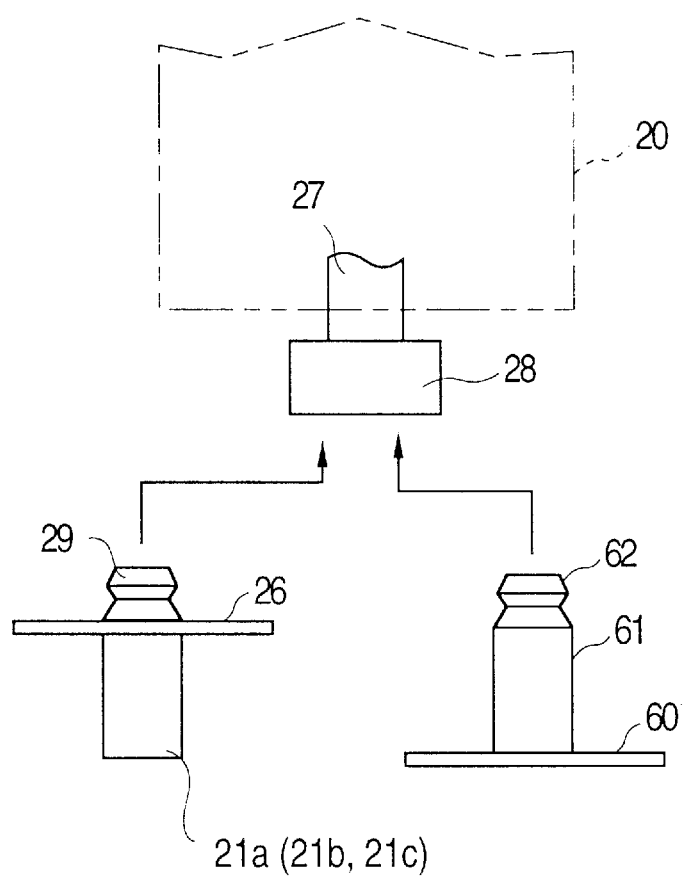
FIG. 7 is a side view of a nozzle and jig of the mounting apparatus of FIG. 1.

Referring to FIG. 3, the carriage head 20 shown in FIG. 1 has a plurality of nozzles 21a, 21b, and 21c (three nozzles are used in this embodiment). These nozzles vacuum chuck chips 12. Vertical shafts 27 have nozzle holders 28, which hold nozzles 21a, 21b and 21c. These nozzles are detachable from the nozzle holders 28. As shown in FIG. 7, a back plate 26 and an engagement 29 are incorporated with the nozzle 21a (which is representative of the three nozzles), and the nozzle 21a can be replaced with a different type by inserting/extracting the engagement 29 into/from the nozzle holder 28.

As shown in FIG. 3, a Z-axis motor 22 rotates a vertical feed screw 23b which screws into a nut 23a in order to move the nozzle 21a up and down. A shaft 27 is rotatably coupled with the nut 23a. A θ motor 24 rotates the shaft 27 around the shaft center by the angle of θ with a belt 25. Therefore, when the z-axis motor 22 drives, the nozzles 21a, 21b and 21c rise and fall individually, and when the θ motor 24 drives, the nozzles 21a, 21b and 21c rotate horizontally. The three nozzles 21a, 21b and 21c are aligned in a straight line along the transferring direction of the substrate 3, i.e. X direction, and held by the carriage head 20.

Figure 4:
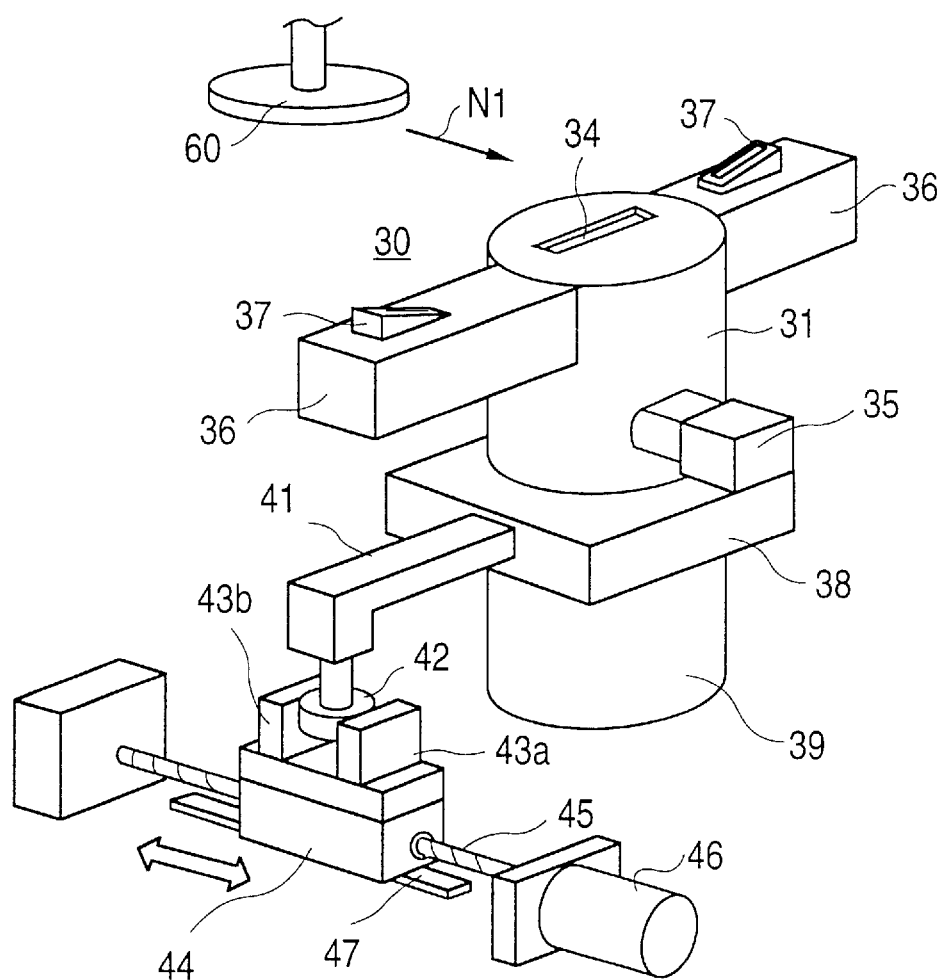
FIG. 4 is a perspective view of a recognition member of the mounting apparatus of FIG. 1.
Figure 5:
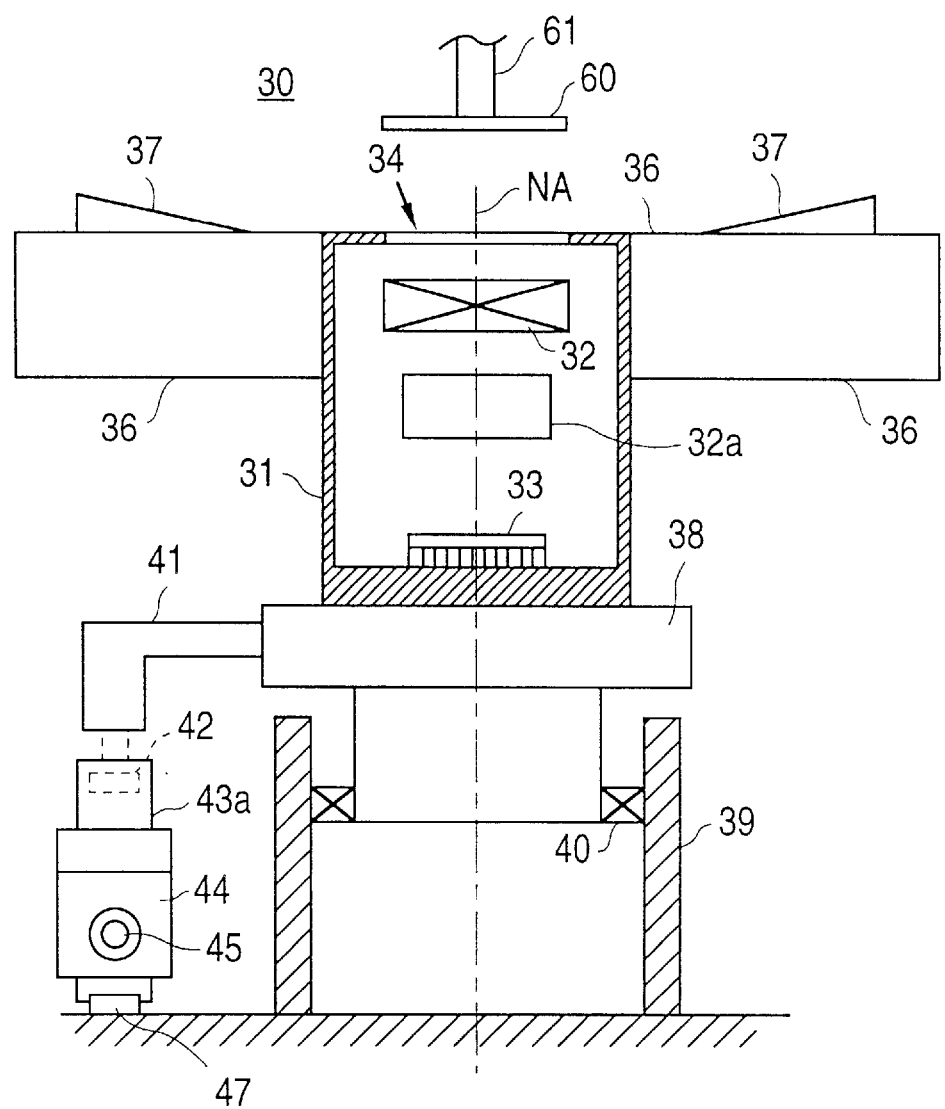
FIG. 5 is a cross section of the recognition member of FIG. 4.

A recognition member 30 is disposed between the guide rail 2 and the part-feeders 4 as shown in FIGS. 1 and 2. An exemplary embodiment of the recognition member 30 is illustrated in FIG. 3 through FIG. 5. As shown, a cylindrical tube 31 has a lens system 32 and a line-sensor 33 thereon. On an upper end of tube 31, a slit 34 opens for receiving the light into the line-sensor 33. A camera 35 for a TV monitor is disposed on the side of tube 31, and a half mirror 32a is incorporated therein for transmitting the light from the slit 34 into the camera 35. Sub-cases 36 are mounted on both sides of tube 31, and light sources 37 for lighting are disposed on the sub-cases 36. The tube 31 is mounted on a turntable 38, which is rotatably mounted to a support tube 39 with bearings 40. An arm 41 is extended from the turntable 38. On the tip of arm 41, a roller 42 is connected. The roller 42 interfits between holders 43a and 43b, which is mounted on a nut 44. A ball screw 45 is screwed into the nut 44. A motor 46 drives to rotate the ball screw 45, then the nut 44 moves along the ball screw 45 and a guide rail 47, thereby rotating the turntable 38 and adjusting the rotation angle of the line-sensor 33. The elements denoted with 41 through 47 constitute the rotation angle adjusting means to accurately adjust the rotation angle of line-sensor 33.

Figure 8:
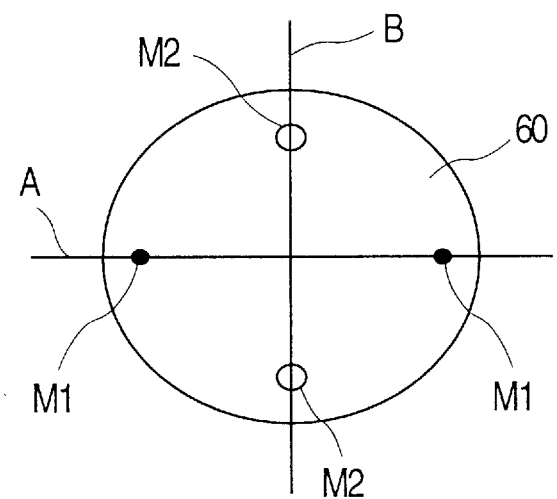
FIG. 8 is a bottom view of the jig of FIG. 7.

An exemplary embodiment of the jig is illustrated by FIGS. 7 and 8. The jig 60 forms a disk, and a rod 61 stands at the center thereof. On the upper end of rod 61, a fitting part 62 is formed, and the fitting part 62 is detachably engaged with the nozzle holder 28. As shown in FIG. 8, on the lower surface of the jig 60, two first targets M1 and also two second targets M2 are formed. The straight line A connecting the two M1 crosses the straight line B connecting the two M2 at right angles. As explained in detail below, the line-sensor 33 recognizes two M1 targets as well as the two M2 targets in order to adjust the rotation angle of the line-sensor 33. It is noted that, with regarding to the shape, color, size, and quantity of the first target M1, any different marks other than those used in this embodiment are acceptable provided they indicate a transferring direction of the carriage head 20. Regarding the second target M2, any marks are acceptable provided they indicate the direction crossing the transferring direction of the carriage head 20 at right angles. It is noted that the targets are not limited to the forms disclosed in this embodiment.

Figure 6:
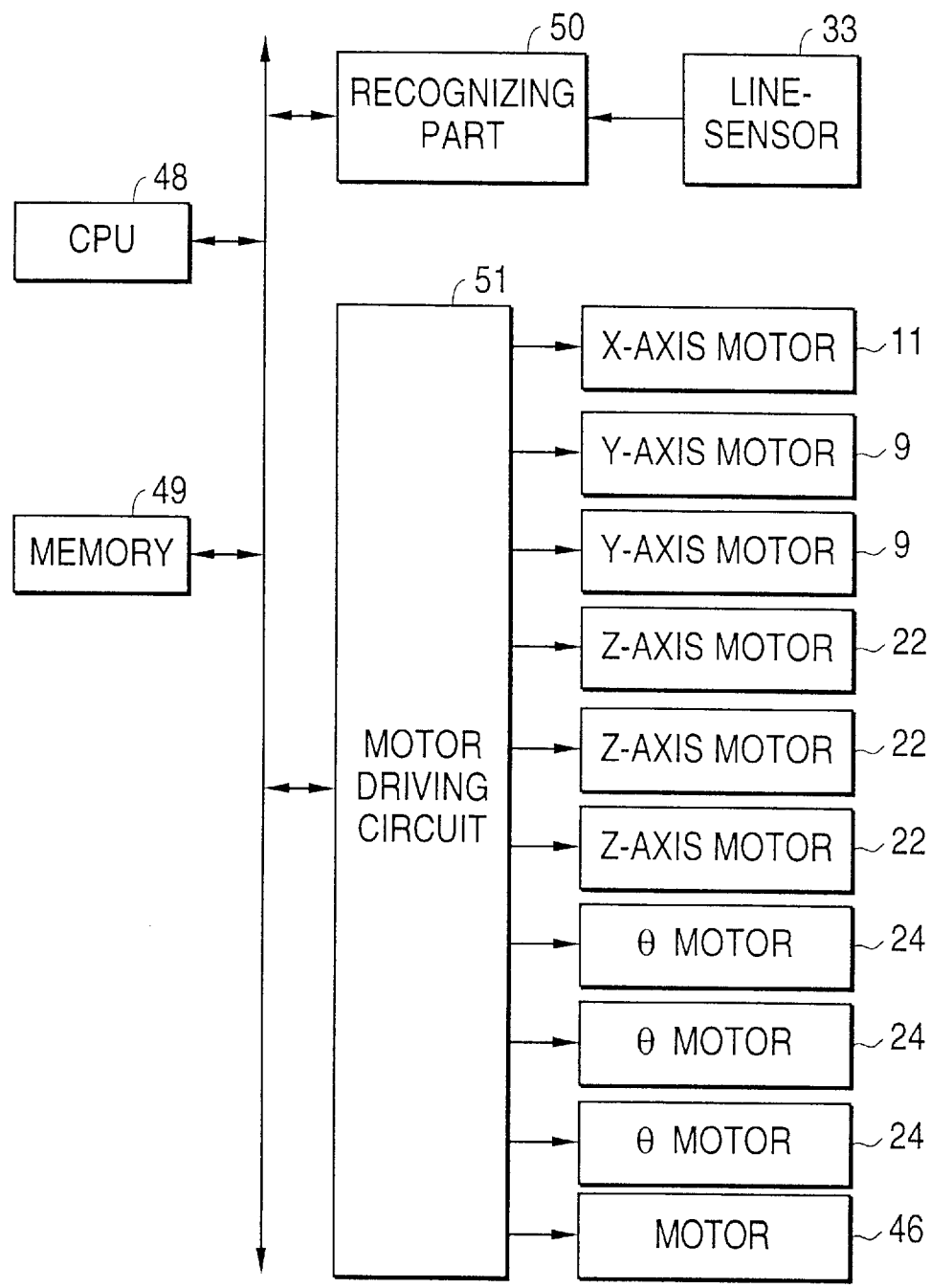
FIG. 6 is a block diagram of a driving unit of the mounting apparatus of FIG. 1.

FIG. 6 is a block diagram of an exemplary driving system. A CPU 48 controls an overall mounting apparatus of electronic components, a memory 49 stores various program and data required for the process of the CPU 48. A recognition part 50 recognizes postures and positions of the chip 12 vacuum chucked by the nozzles 21a, 21b and 21c as well as the jig 60. A motor driving circuit 51 drives the X-axis motor 11, Y-axis motor 9, Z-axis motor 22, θ motor 24, and motor 46 based on commands from the CPU 48.

When the line-sensor 33 in the embodiment slants by θ degree with regard to the direction across the chip transferring direction at right angles, a distortion occurs in the position recognition of the chip 12, and mounting accuracy is not improved. In order to overcome this problem, the slant of the line-sensor 33 must be compensated so that the longitudinal direction of the line-sensor 33 crosses the transferring direction of chip 12 at right angles.

Figure 10:
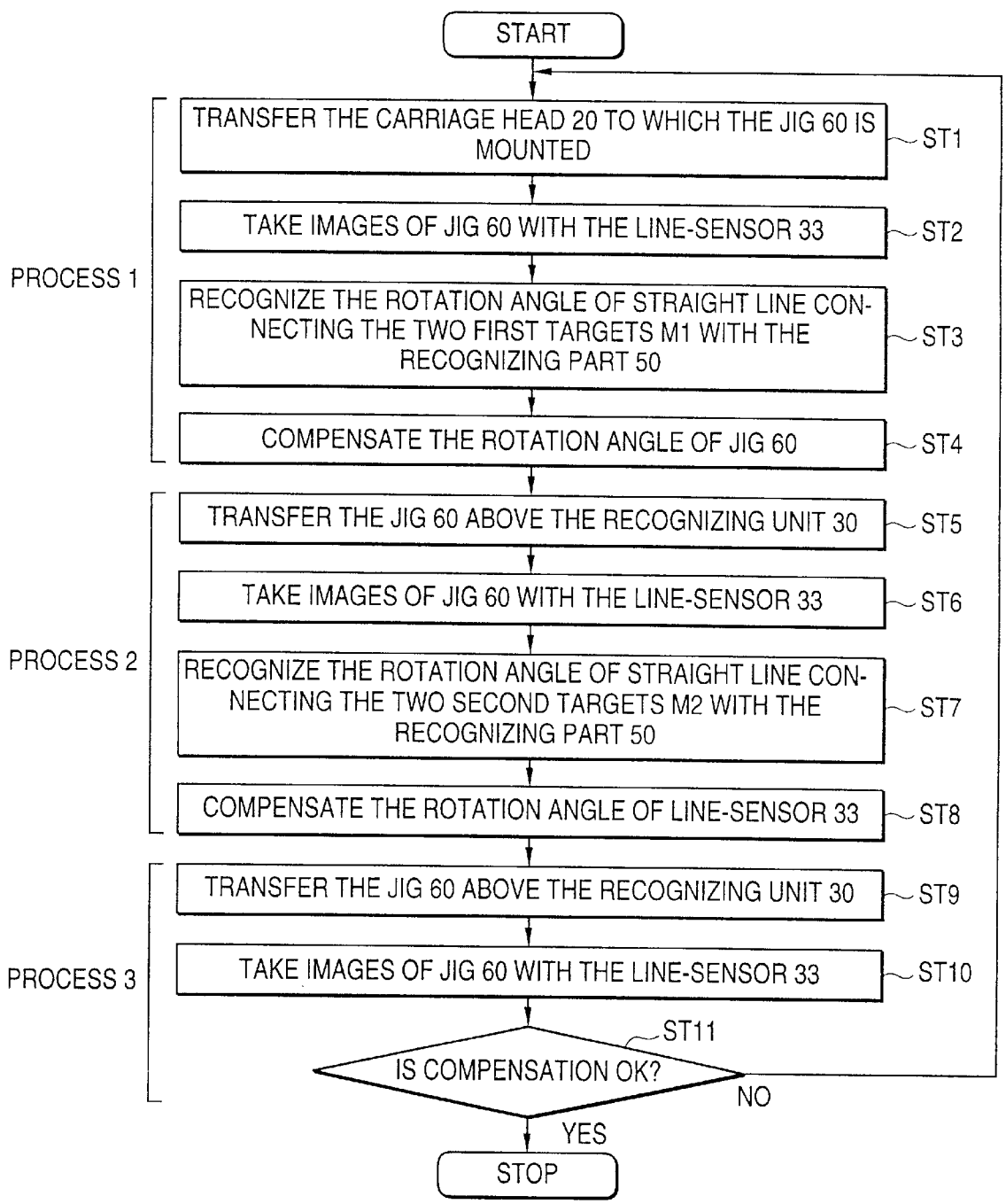
FIG. 10 is a flowchart showing how to adjust the rotation angle of the line-sensor of the mounting apparatus.

An exemplary method for compensating the rotation angle of line-sensor 33 so that the longitudinal direction of line-sensor 33 crosses the transferring direction of chip 12 at right angles is illustrated in FIGS. 7, 9 and 10.

FIG. 7. depicts the following two steps (ST1 and ST2 which are detailed in FIG. 10):

ST 1. Remove the nozzle 21a (representative of 21a, 21b and 21c) from the nozzle holder 28, and mount the jig 60 thereto. Then, drive the X-axis table 6 and Y-axis table 5 in order to transfer the jig 60 above the slit 34 of the recognition member 30 along the direction (N1) across the longitudinal direction of line-sensor 33 possibly at right angles. (N1 will be detailed later.)

ST 2. Take the image of jig 60 through the line-sensor 33.

As shown in FIG. 9, Process 1 depicts the status on ST 2: the status of jig 60 is illustrated in Process 1-A of FIG. 9, the status of line-sensor 33 is illustrated in Process 1-B of FIG. 9, and the image of jig 60 is shown in Process 1-C of FIG. 9. As illustrated, the straight line connecting the two first targets M1 of the jig 60 slants with regard to the transferring direction (N1) of the carriage head 20 by a rotation angle "a", and the line-sensor 33, as shown in 1-B, also slants with regard to the direction across the N1 direction at right angles by a rotation angle "b". Thus, the straight line connecting the two first targets M1 is observed in the image taken on ST 2 to slant with regard to N1 direction by a rotation angle "c", which is approximately the same as the rotation angle "a" of jig 60 as long as the rotation angle "b" is small enough.

The next steps in the process entail recognizing the rotation angle "a" by the recognition part 50 (ST3), then rotating the jig 60 by the rotation angle "c" by driving the θ motor 24 incorporated in the carriage head 20. This results in compensating the rotation angle of jig 60 or a mounting angle thereof with regard to the carriage head 20 (ST4). Process 2-A depicts the jig 60 accordingly compensated, where the straight line connecting the two first targets M1 is oriented in the same direction as the N1 direction. Next, the jig 60 is again transferred above the line-sensor 33 along the N1 direction to take in the image of jig 60 again (ST5 and ST6). Process 2-C shows the image obtained through ST5 and ST6, where the straight line connecting the first two targets M1 is oriented in the same direction as N1 direction. The straight line connecting the two second targets M2 slants by a rotation angle "d" with regard to the direction across the N1 direction at right angles. This rotation angle "d" is no other than the rotation angle "b" (slant degree of line-sensor 33 with regard to the direction across the N1 direction at right angles.) Thus, similar to above, the process entails recognizing the rotation angle "d" with the recognition part 50 (ST7), and driving the motor 46 shown in FIG. 4 to horizontally rotate the line-sensor 33 disposed on the turntable 38, thereby revising the rotation angle "d" (ST8). The rotation angle "b" of line-sensor 33 is thus compensated as shown in process 3-B, and the longitudinal direction of line-sensor 33 becomes across N1 direction at right angles.

Next, the jig 60 is again transferred above the recognition member 30 to take in the image of jig 60 through the line-sensor 33 for which the rotation angle has been compensated (ST9 and ST10). Verify the revision of rotation angle with the recognition part 50 based on the image taken in ST10 (ST11). If the revision is not correct, repeat the process from ST1. Process 3-C shows the image of jig 60 taken through the line-sensor 33 for which the rotation angle is compensated correctly.

After revising the rotation angle of line-sensor 33, remove the jig 60 from the nozzle holder 28 shown in FIG. 7, and attach the nozzle 21a to the nozzle holder 28.

Figure 11:
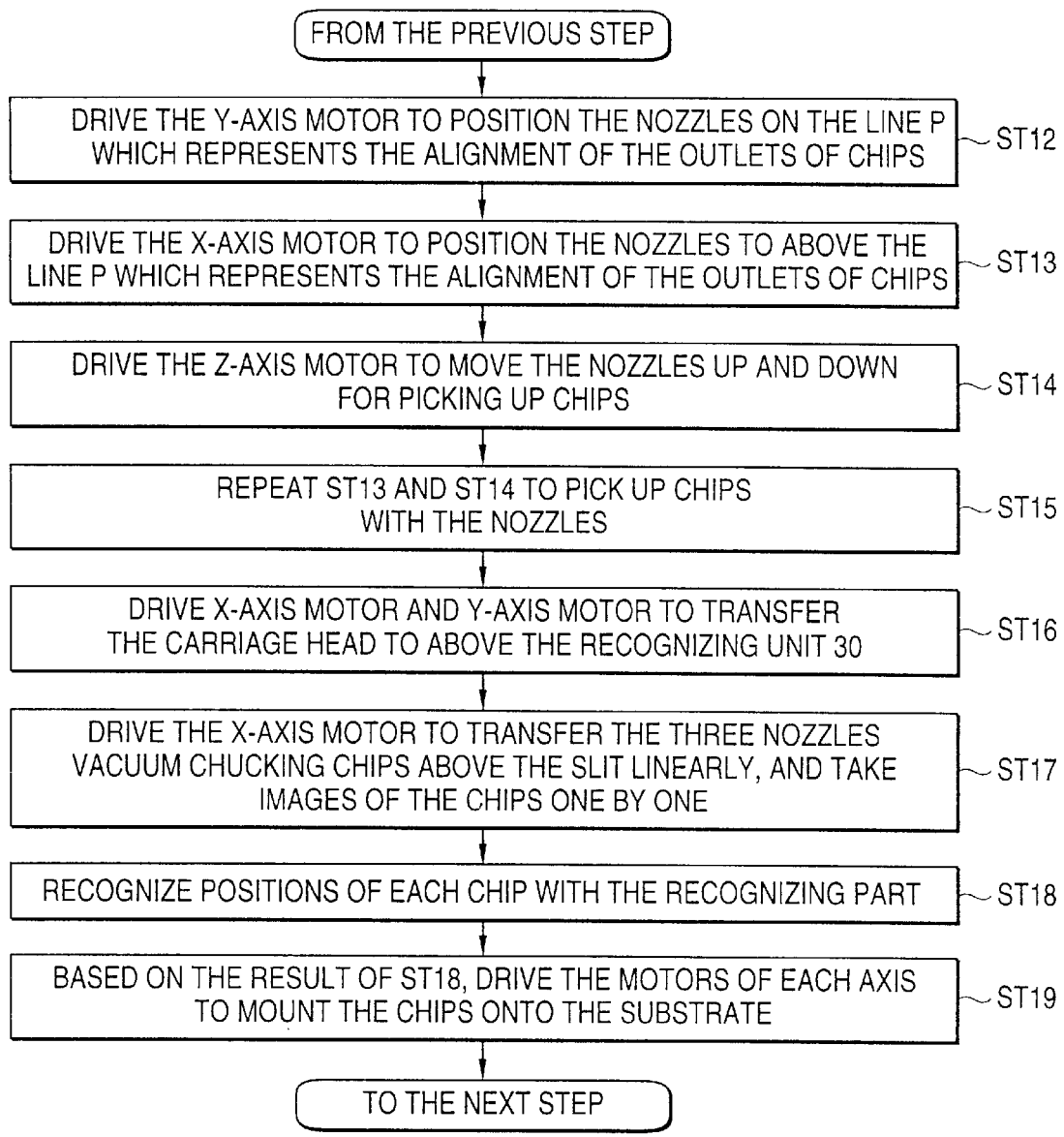
FIG. 11 is a flowchart showing how to mount electronic components using the mounting apparatus of the present invention.

A method for mounting an electronic component in accordance with the present invention is explained with reference to FIG. 11.

First, drive the Y-axis motor 9 so that the nozzles 21a, 21b and 21c are positioned on a straight line P on which the outlets for taking out the chip 12 are aligned (ST12). Then, drive the X-axis motor 11 to transfer the nozzle 21a, 21b and 21c above the straight line P along X direction (ST13), and stop the nozzles above the specified part-feeder 4, where the X-axis motor drives to lower or raise one of the nozzles to vacuum chuck the chip 12 at the bottom thereof (ST14). Repeat ST13 and ST14 to pick up the chips 12 one by one with those nozzles (ST15). When picking up the very first chip 12, ST1 and ST2 can be done at the same time.

Figure 12:
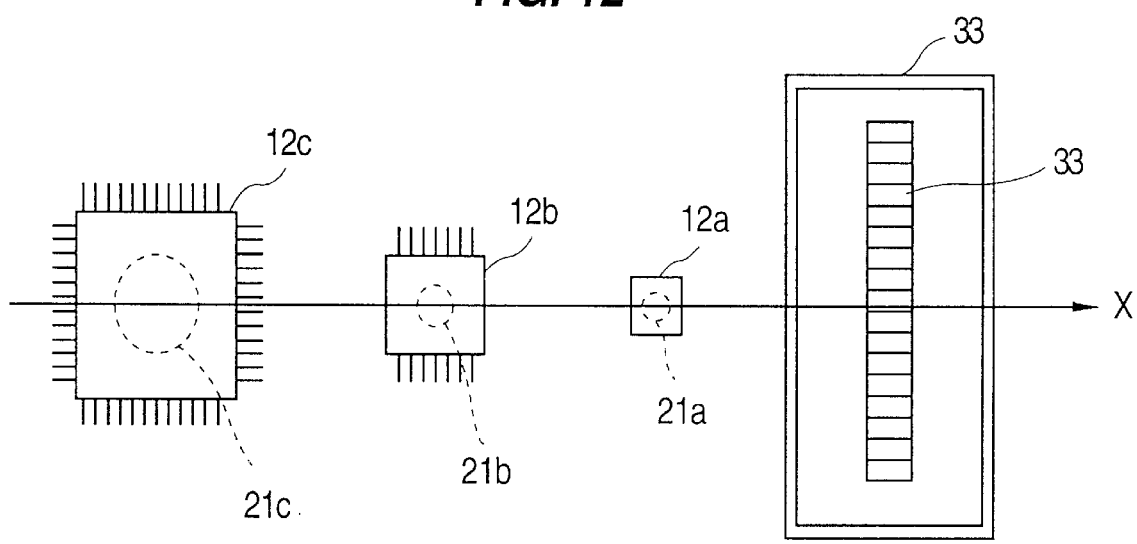
FIG. 12 illustrates how to take an image of an electronic component through the line-sensor of the mounting apparatus.
Figure 13:
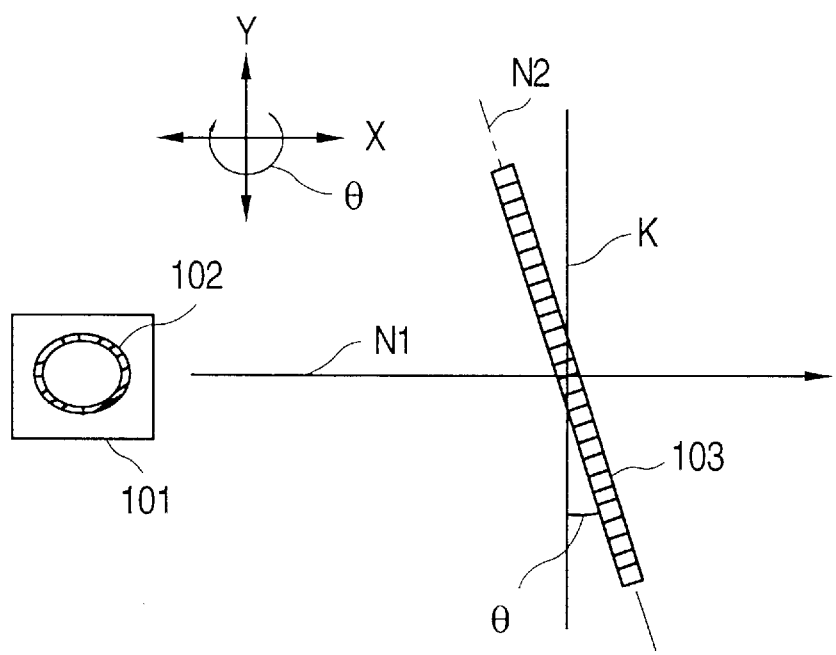
FIG. 13 depicts how to recognize a chip in a conventional mounting apparatus of electronic components.

Second, drive the X-axis motor 11 and Y-axis motor 9 to transfer the carriage head 20 above the recognition member 30 (ST16) and then drive the X-axis motor 11 to transfer the nozzle 21a, 21b and 21c above the slit 34 straight in the X direction, thereby taking in the image of each chip 12 through the line-sensor 33 (ST17). FIG. 12 depicts the recognition operation of various chips 12a, 12b and 12c vacuum chucked by the nozzle 21a, 21b and 21c. Since the three nozzles are aligned along the X direction, the images of the three chips 12a, 12b and 12c are taken in sequence by transferring the carriage head 20 above the line-sensor 33 straight along the X direction, even when the three chips vacuum chucked by the three nozzles are different sizes. In this case, the carriage head 20 is transferred only by the X-axis motor 11 of X-axis table 6. Thus, the Y-axis motor 9 may stay idle, which simplifies control requirements.

Third, recognize the positions of each chip 12 from the images taken by the recognition part 50 (ST18), then based on the recognition result, drive the X-axis motor 11, Y-axis motor 9 and θ motor 24 in order to compensate position-deviations of each chip 12 with regard to X, Y, and θ directions.

Finally, mount each chip 12 onto the specified coordinate positions of the substrate 3 (ST19). Thus various chips 12 can be mounted in sequence onto the substrate 3 by repeating the above steps.

Since the rotation angle of line-sensor 33 has been already adjusted, the longitudinal direction of the line-sensor 33 is across the chip transferring direction at right angles without a bit difference. Therefore, the correct image of each chip 12 without any distortion can be obtained through the line-sensor 33, and thus the position-deviations can be accurately detected. As a result, each chip 12 can be mounted with high accuracy.

It is possible to mount the jig 60 to the carriage head 20 with high positioning accuracy. Therefore, when the jig 60 is mounted with a positioning error less than tolerance, the steps ST1 through ST4 are not necessary. In this case, the users may start the process from the step ST5. Regarding the rotation angle adjusting means, it is not limited to the above motor 46, but manual operation can rotate the line-sensor 33, and the structure thereof is, of course, not limited to the above embodiment. Further, a mounting position of jig 60 can be any other positions of carriage head 20 than the nozzle holder 28, provided the position is moved horizontally together with the nozzle holder 28. In this case, the nozzle holder is not necessarily detachable.

Regarding the operation in the step ST13, the Y-axis motor 9 preferably stays idle. However, in the following case, the Y-axis motor 9 may be driven to compensate the position-deviations of nozzle 21a, 21b and 21c with regard to Y direction so the nozzles 21a, 21b, and 21c can pick up each chip 12 accurately: the outlets for taking chips out from the part-feeder 4 is deviated from the straight line P, or the nozzle 21a, 21b and 21c are not aligned accurately on the line parallel with X direction, in such a case, each chip 12 may possibly fail to be picked up.

Further, two recognition members 30 can be used, namely, two units are disposed both sides of guide rail 2 individually.

Of course, it should be understood that a wide range of changes and modifications can be made to the preferred embodiments described above. It is therefore intended that the foregoing detailed description be regarded as illustrative rather than limiting and that it be understood that it is the following claims, including all equivalents, which are intended to define the scope of the invention.

What is claimed is:

1. An apparatus for mounting electronic components comprising:

a substrate transferring means for transferring a substrate, a carriage head comprising a plurality of nozzles aligned along a predetermined axis, a X-axis table for transferring said carriage head substantially parallel along the predetermined axis, a Y-axis table for transferring said carriage head across the predetermined axis at substantially right angles thereto, a plurality of part feeders disposed on the side of said substrate transferring means, and a line-sensor disposed adjacent said substrate transferring means and said plurality of part feeders, said line-sensor having a longitudinal axis extending at substantially right angles to said predetermined axis, said line-sensor having an upper surface which is parallel to a surface of the substrate on which said electronic components are mounted, said line-sensor receiving a signal incident on said upper surface, said carriage head being transferred above said line-sensor along the predetermined axis to take images in sequence of electronic components vacuum chucked by said nozzles, said line sensor operative for taking said images of said electronic components so as to ascertain said positions of said electronic components being recognized, said line sensor being stationary when taking images of said electronic components, and said carriage head being transferred based on the recognized positions of said electronic components above said substrate, said electronic components vacuum chucked by said nozzles being mounted onto specified coordinate spots of said substrate.

2. An apparatus for mounting electronic components comprising:

a carriage head for picking up electronic components stacked in part feeders by vacuum chucking them with nozzles, and transferring and mounting the electronic components onto the substrate, a line-sensor disposed along a path of said carriage head, said line sensor operative for taking images of said electronic components, said line sensor being stationary when taking images of said electronic components and a rotation adjusting means for adjusting said line-sensor so as to compensate for a deviation of said line-sensor from a predetermined axis by rotating said line-sensor such that a longitudinal axis of said line sensor is parallel with said predetermined axis.

3. A method of mounting electronic components comprising the steps of:

detecting a deviation of a line-sensor from a first predetermined axis, compensating for said deviation of said line sensor from said first predetermined axis by rotating said line sensor such that a longitudinal axis of said line sensor is parallel with said first predetermined axis, picking up electronic components stacked in part feeders in sequence with a plurality of aligned nozzles by transferring a carriage head holding the aligned plurality of nozzles along a second predetermined axis and above the part feeders disposed along the second predetermined axis, taking images in sequence of the electronic components vacuum chucked by said nozzles by transferring said carriage head comprising the aligned nozzles above said line-sensor disposed adjacent a substrate and said part feeders, said longitudinal direction of the line-sensor across at substantially right angles to said second predetermined axis, said line sensor being stationary when taking images of said electronic components, recognizing positions of said electronic components vacuum chucked by said nozzles based on the taken images, and mounting said electronic components vacuum chucked by said nozzles in sequence onto specified coordinate spots by transferring said carriage head above said substrate based on the recognized positions.

4. A method of mounting electronic components vacuum chucked to the bottom of nozzles disposed on a carriage head, said electronic components are observed by a line-sensor which takes images of the electronic components and based on the images taken by the line-sensor positions of the electronic components are recognized and the electronic components are mounted onto the substrate in accordance with the recognized positions, said method further comprising the steps of:

detecting a rotation angle of said line-sensor through an image recognition by said line-sensor taking an image of a target formed on a jig mounted to said carriage head, said jig being transferred above said line-sensor, revising said rotation angle of said line-sensor to being across the transferring direction of said carriage head at right angles by horizontally rotating said line-sensor, and mounting the electronic components vacuum chucked at the bottoms of the nozzles of said carriage head through observing said electronic components with the line-sensor of which rotation angle has been compensated and recognizing positions of said electronic components based on images taken thereof with said line-sensor.

5. A method of mounting electronic components vacuum chucked at the bottom of nozzles disposed on a carriage head, said electronic components are observed by a line-sensor which takes images of the electronic components and based on the images taken by the line-sensor positions of the electronic components are recognized and the electronic components are mounted onto the substrate, said method further comprising the steps of:

detecting a rotation angle of a jig mounted to said carriage head through recognizing an image of a target formed on the jig with the line-sensor, said jig being transferred above the said line-sensor, revising the rotation angle of the jig based on the detected rotation angle by horizontally rotating the jig, detecting a rotation angle of said line-sensor through an image recognition by said line-sensor taking an image of a target formed on a jig mounted to said carriage head, said jig of which rotation angle has been compensated being transferred again above said line-sensor to recognize said target on the jig, revising said rotation angle of said line-sensor to being across the transferring direction of said carriage head at right angles by horizontally rotating said line-sensor, and mounting the electronic components vacuum chucked at the bottoms of the nozzles of said carriage head through observing said electronic components with the line-sensor of which rotation angle has been compensated and recognizing positions of said electronic components based on images taken thereof with said line-sensor.

* * * * *